United States Patent
Tng et al.

(10) Patent No.: US 6,369,728 B1
(45) Date of Patent: Apr. 9, 2002

(54) METHOD AND SYSTEM FOR REAL-TIME PROCESSING OF THE RECORDED PCM DATA TO GET THE DESIRED FULL-SCALE RANGE OF VALUES

(75) Inventors: Seng-Khoon Tng; Inging Yang, both of Milpitas, CA (US)

(73) Assignee: Waytech Investment Co. Ltd. (VG)

( * ) Notice: Subject to any disclaimer, the term of this patent is extended or adjusted under 35 U.S.C. 154(b) by 0 days.

(21) Appl. No.: 09/665,491

(22) Filed: Sep. 20, 2000

(51) Int. Cl.$^7$ ............................................. H03M 1/18
(52) U.S. Cl. ....................................................... 341/139
(58) Field of Search ................................ 341/139, 179, 341/87, 75; 375/242

(56) References Cited

U.S. PATENT DOCUMENTS

| | | | |
|---|---|---|---|
| 4,349,913 A | * | 9/1982 | Skoog ........................ 341/139 |
| 5,646,621 A | | 7/1997 | Cabler et al. |
| 5,757,299 A | | 5/1998 | Noro et al. |
| 5,940,019 A | | 8/1999 | Maejima |

* cited by examiner

Primary Examiner—Brian Young
(74) Attorney, Agent, or Firm—Carr & Ferrell LLP

(57) ABSTRACT

A method and apparatus for processing pulse code modulation (PCM) data that do not reach the full dynamic range of a transmission bus. The method and apparatus provide an output processed PCM data having the maximum peak signal allowable by a transmission bus. The output signal limitation is also dependent on a sampling or recording frequency of input signals. In view of the sampling or recording frequency, the invention scales the processing of the PCM data accordingly.

27 Claims, 3 Drawing Sheets

METHOD AND SYSTEM FOR REAL-TIME PROCESSING OF THE RECORDED PCM DATA TO GET THE DESIRED FULL-SCALE RANGE OF VALUES

FIELD OF THE INVENTION

The invention relates to processing pulse code modulation (PCM) data via a sigma-delta analog/digital (A/D) converter, particularly to recovering PCM data attenuated by the sigma-delta A/D converter.

BACKGROUND

In a signal processing system, a sigma-delta A/D converter is typically implemented for generating PCM data from input signals. Specifically, before undergoing processing by the sigma-delta A/D converter, the strength (amplitude) of input signals need to be reduced. Otherwise, the sigma-delta A/D converter could be saturated such that the PCM data generated by the saturated sigma-delta A/D converter are distorted. However, if the amplitude of input signals is reduced before undergoing processing by the sigma-delta A/D converter, the PCM data generated by the sigma-delta A/D converter do not reach the maximum code achievable within the width of the data path within the signal processing system.

Prior art approaches scale the PCM data back to the maximum code achievable within the width of the data path. Unfortunately, the scaling performed by prior art approaches do not always produce the desired result. In particular, the scaling factor for the PCM data generated by a sigma-delta converter actually depends on the sampling rate or recording frequency of input signals. But the prior art approaches do not account for this dependency between the proper scaling factor and the given sampling or recording frequency.

Thus, a need exists to compensate for the amplitude reduction of input signals to a sigma-delta A/D converter implemented within a signal processing system. Specifically, a need exists for scaling the amplitude of the PCM data back to the full-scale value achievable within the width of a data path within the signal processing system containing the sigma-delta A/D converter. Furthermore, a need exists for scaling the amplitude of the PCM data in accordance with the sampling rate or recording frequency of input signals en route to a sigma-delta A/D converter within a signal processing system.

SUMMARY OF THE INVENTION

The invention provides compensation for the amplitude reduction of input signals of a sigma-delta A/D converter within a signal processing system. Specifically, the invention provides scaling of the amplitude of the pulse code modulation (PCM) data back to the full-scale value achievable within the width of a data path within the signal processing system. Furthermore, the invention achieves the full-scale value of the PCM data in accordance with the sampling rate or recording frequency of input signals en route to a sigma-delta A/D converter within a signal processing system.

Advantageously, the invention is able to generate a scaling factor based on a sampling or recording frequency of input signals en route to a sigma-delta converter. Moreover, the invention is able to change the scaling factor to a new scaling factor in response to a new sampling or recording frequency. In one embodiment of the invention, scaling factors or contents of a scaling factor lookup table can be dynamically changed. In particular, the methods for generating and changing scaling factors can be implemented in software for a general purpose CPU. Additionally, the invention only adds minimal latency to the data stream.

Preferably, the invention is drawn to a method and a system for processing PCM data generated by a sigma-delta analog/digital (A/D) converter. A scaling factor is determined in accordance with a sampling frequency of an input signal to be processed by the sigma-delta A/D converter. The scaling factor is used to scale the PCM data to the maximum dynamic range allowed by the width of a data path associated with the transmission bus coupled to the sigma-delta A/D converter.

In response to an interrupt from an audio digital controller coupled to the sigma-delta A/D converter, a software device driver copies a block of PCM data within a direct memory access (DMA) buffer coupled to the sigma-delta A/D converter. Optionally, this copying operation can also be triggered by an interrupt from the User Application. The copied block of PCM data is scaled via the device driver by multiplying the copied PCM data by the scaling factor. The device driver then rails the scaled PCM data such that the dynamic range of said PCM data remains within the width of the data path of the transmission bus. In turn, the scaled and railed PCM data is sent to a user/application buffer for data consumption.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings which are incorporated in and form a part of this specification, illustrate embodiments of the invention and together with the description, serve to explain the principles of the invention.

DETAILED DESCRIPTION

Reference is made in detail to the preferred embodiments of the invention. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1:
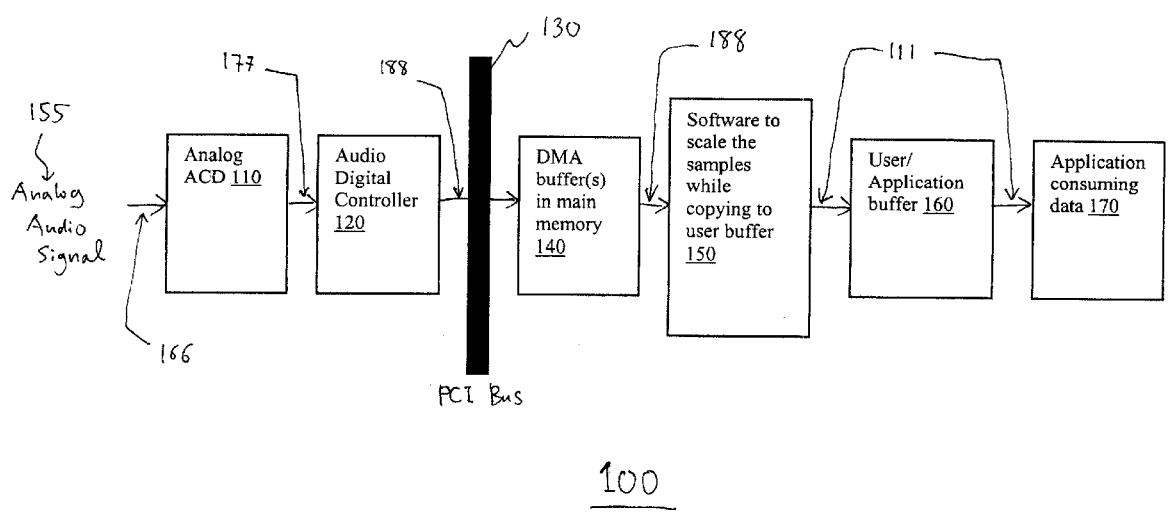
FIG. 1 shows a top-level system for generating pulse code modulation (PCM) data in accordance with one embodiment of the invention.

Referring now to FIG. 1, a top-level system 100 is shown for generating pulse code modulation (PCM) data in accordance with one embodiment of the invention. System 100 comprises a sigma-delta analog/digital (A/D) converter 110, an audio digital controller 120, a bus 130, a direct-memory access (DMA) buffer 140 in main memory, a scaling driver 150, a user/application buffer 160, and an application 170 that consumes the recorded PCM data.

Referring still to FIG. 1, sigma-delta A/D converter 110 is coupled to audio digital controller 120, which is coupled via bus 130 to DMA buffer 140. Additionally, DMA buffer 140 are coupled to scaling driver 150, which is coupled to user/application buffer 160. The PCM data in the user buffer 160 is consumed by an application 170.

Continuing with FIG. 1, an input signal 155 for system 110 is first sent to be processed by sigma-delta A/D converter 110. Specifically, input signal 155 is intended to be converted into PCM data format. However, in order to avoid saturating sigma-delta A/D converter 110, amplitude of input signal 155 is reduced before undergoing processing by sigma-delta A/D converter 110. As such, amplitude of input signal 155 is reduced to create a new input signal 166, which is then sent to sigma-delta A/D converter 110. In turn, input signal 166 is converted by sigma-delta A/D converter 110 into PCM data 177 that, with further modification, are to be consumed by various applications.

Continuing still with FIG. 1, sigma-delta A/D converter 110 is adapted to send recorded PCM data to DMA buffers 140. However, because PCM data 177 are generated from input signal 166 (which is modified from the original input signal 155), PCM data 177 do not faithfully represent input signal 155. As such, PCM data 177 are not as wide as the full width allowable within the data path of bus 130. Consequently, in the present embodiment of the invention, PCM data 177 undergo further processing to compensate for the reduction performed on input signal 155.

The digital audio control 120 receives the audio data 177 and send it over the bus 130 to the DMA buffer 140. The processing of the data (in this embodiment) is done by software device driver (150) and not in the controller (120). But there are other embodiments where the processing could be done in the controller (120). Then PCM data 177 are delivered via bus 130 to DMA buffer 140. When PCM data 177 reach DMA buffer 140, scaling driver 150 copies a block of PCM data from DMA buffer 140 to user/application buffer 160. As scaling driver 150 performs the copying operation, scaling driver 150 also scales PCM data 177 into PCM data 199 (not shown). Scaling driver 150 further rails PCM data 199 into PCM data 111 if PCM data 199 exceed maximum size allowed within the width of the data path of bus 130. In turn, PCM data 111 are sent to user/application buffer 160 for consumption by application 170. This consumption operation can be triggered by an interrupt from audio digital controller 120 when a block of PCM data is filled. Additionally, this consumption operation can be triggered asynchronously by a software application program (e.g., application 170) requesting more PCM data to user/application buffer 160. In another embodiment, application 170 could be polling Audio Digital Controller 120 continuously for new data to start the consumption operation.

Advantageously, scaling driver 150 is adapted to generate a scaling factor (for scaling PCM data 188) based on a sampling or recording frequency of input signal 155 en route to sigma-delta converter 110. Moreover, scaling driver 150 is able to change to a new scaling factor in response to a new sampling or recording frequency of input signal 155. In one embodiment of the invention, scaling factors or contents of scaling factor lookup table can be dynamically changed. In particular, the methods performed by scaling driver 150 for generating and changing scaling factors can be implemented in software for a general purpose CPU. Additionally, processing by scaling driver 150 adds little to the latency of the data stream.

As understood herein, scaling driver 150 for scaling PCM sample data 188 need not be implemented in software. For example, in another embodiment, the scaling steps are performed in hardware such as, for example, a microcontroller. In yet another embodiment, the scaling steps are performed by a mixture of software and hardware.

Figure 2:
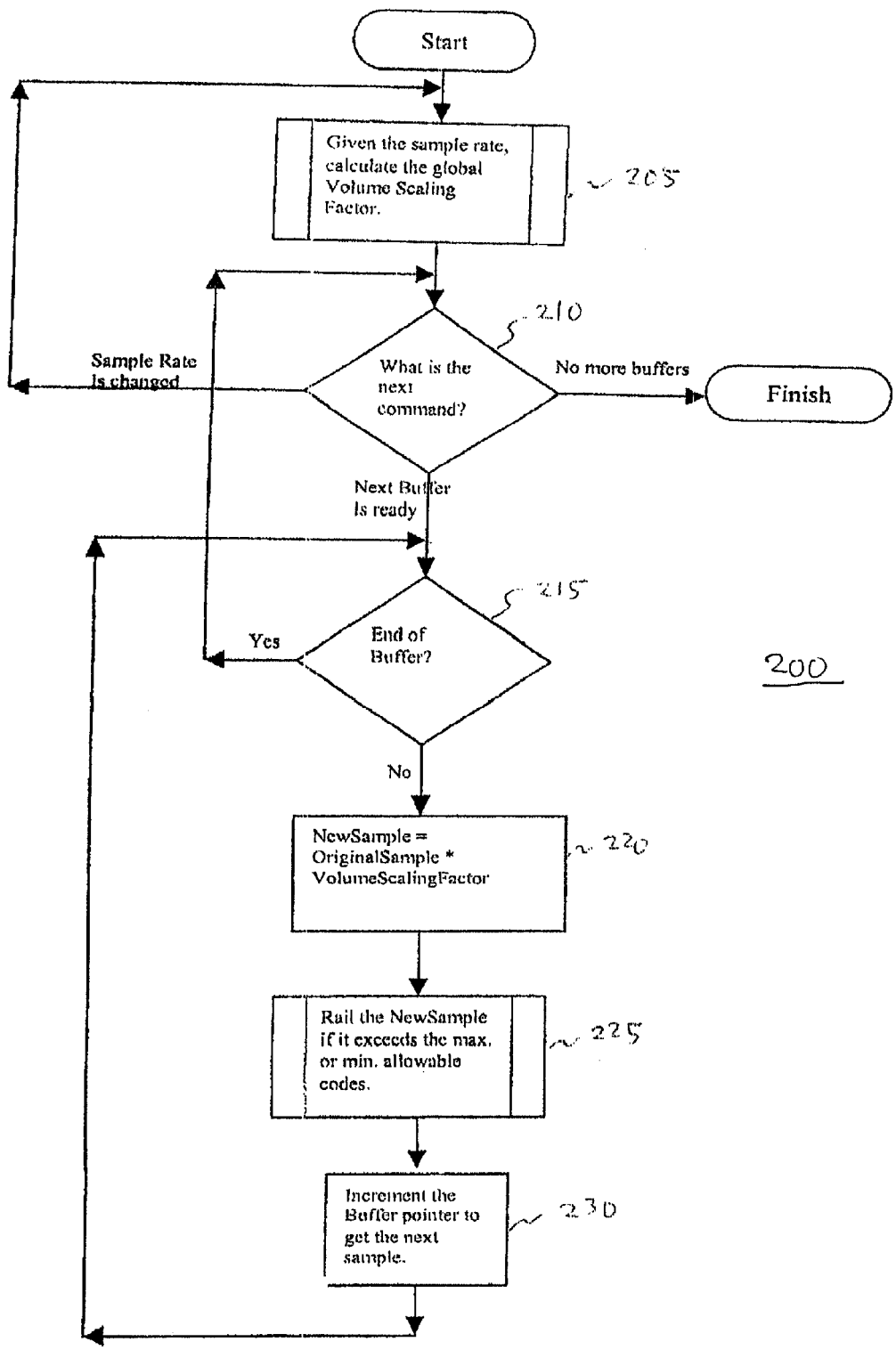
FIG. 2 is flow chart outlining steps for processing PCM data in accordance with one embodiment of the invention.

Referring now to FIG. 2, a flow chart 200 is shown outlining steps for the PCM data processing performed by a software device driver (e.g., scaling driver 150 shown in FIG. 1) in accordance with one embodiment of the invention.

In step 205, a global volume scaling factor, or a scaling factor, is calculated in accordance with a given sampling frequency for input signals en route to a sigma-delta A/D converter. As explained previously, this scaling factor is used to scale PCM data generated by the sigma-delta A/D converter, since the generated PCM data do not encode the original input signal but rather the "attenuated" input signal.

In query step 210, the next command is evaluated. If no more DMA buffers are available, the PCM processing terminates. If next DMA buffer is ready, then another query step (i.e. step 215) is performed. If sampling frequency is changed, then step 205 is repeated to calculate a new scaling factor. As understood herein, the DMA buffer need not be made to accommodate multiple samples. For example, in one embodiment of the invention, the size of DMA buffer can accommodate only one sample. That is, the driver is processing one sample at a time.

In query step 215, a check is made to see if the end of the DMA buffer is reached. If the end of the buffer is reached, query step 210 is repeated. If the end of the DMA buffer is not yet reached, then step 220 is performed.

In step 220, new sample PCM data are made from both the original sample PCM data and the given global volume scaling factor. Specifically, the new sample PCM data are equal to the original sample PCM data multiplied by the given global volume scaling factor.

In step 225, the new sample PCM data undergo railing if they exceed the maximum or the minimum codes allowed by the data path. This step is typically performed by a device driver. The details of step 225 is further shown in FIG. 3.

In step 230, the DMA buffer pointer is incremented to get the next sample PCM data. Then query step 215 is repeated.

Figure 3:
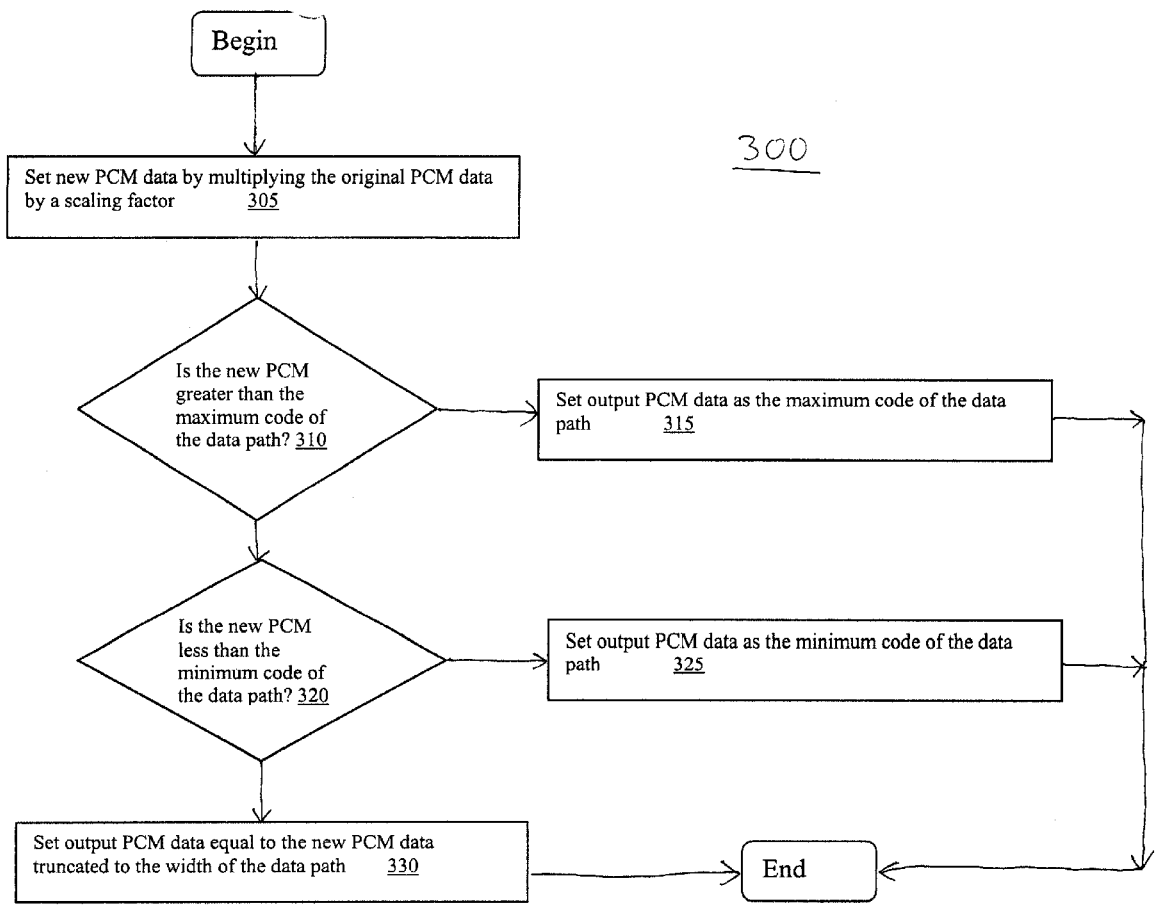
FIG. 3 is a flow chart outlining steps performed by a software device driver in scaling PCM data in accordance with one embodiment of the invention.

Referring now to FIG. 3, a flow chart 300 is shown outlining steps performed by a device driver that processes PCM data in accordance with one embodiment of the invention. Specifically, the device driver is adapted to modify PCM data exiting a sigma-delta A/D converter so that the modified PCM data encode the original input analog signal rather than reduced input analog signal.

In step 305, a new sample PCM data is produced from the sample PCM data generated by sigma-delta A/D converter by multiplying a global scaling factor with the sample PCM data. The global scaling factor, or simply scaling factor, can be acquired in at least three ways. Moreover, the new sample PCM data are not yet the final output sample PCM data. Specifically, the new sample data might need to undergo railing so that the final PCM data produced by the device driver remains within the width of the data path.

Continuing with step 305, more specifically, the global volume scaling factor A[f], where f is the sampling rate, is the multiplier to scale the input sample PCM (to the device driver) up and hence it is always>=1. For some corner cases, a PCM data may exist that is larger than the width of the data path. As such, the samples need to be railed at the maximum value and the minimum value.

A[f] is calculated based on the sampling rate of input signal to the sigma-delta A/D converter. At least three methods exist for calculating A[f].

In one embodiment of the invention, the dependency of A[f] on f is captured in a lookup table. This lookup table has a range of sample rates, wherein each of these sample rates has its corresponding scaling factor. Given the sampling rate f, the corresponding A[f] can be found from the lookup table. In creating this lookup table, actual data from a batch of converters are measured. In turn, the mean value of these data is chosen to be the entry of the lookup table.

In another embodiment of the invention, the dependency of A[f] on f is captured in a formula. As an example, the formula A[f]=1+(B/f) can be used. To find out the value of the constant B, a batch of ADCs is measured and the mean value is chosen.

In yet another embodiment of the invention, the dependency of A[f] on f is captured at runtime through runtime calibration. Specifically, at the system boot time, the device driver attempts to calibrate the system by recording a known and loud signal at various common frequencies. Based on the peak data recorded, a lookup table for A[f] is built at runtime. In addition, the calibration process could be re-initiated at later time to refresh the lookup table.

In query step 310, the new sample PCM data are compared with the maximum value allowed by the width of the data path. If the new sample PCM data are greater than the maximum value, then railing is performed next in step 315. If the new sample data are not greater than the maximum value, then the new sample PCM data are next compared in query step 320 to the minimum value allowed by the width of the data path.

In step 315, the sample output PCM data are set to be the maximum value allowable by the width of the data path.

In query step 320, the new sample PCM data are compared to the minimum value allowable by the width of the data path. If the new sample PCM data are less than the minimum value allowable by the width of the data path, then railing is performed in step 325. If the new sample PCM data are not less than the minimum value allowable by the width of the data path, step 330 is performed.

In step 325, in order to produce an output sample PCM data, the new sample PCM data are railed against the minimum value allowed by the width of the data path. Specifically, the output sample PCM data are set to the minimum value allowable by the width of the data path.

In step 330, the new sample PCM data are truncated to the width of the data path. Then the truncated sample PCM data are set to be the output sample. To improve sound quality, the sample data could be dithered before truncation.

As understood herein, before being modified into the final sample output PCM data, the new sample PCM data referred to above are treated as a temporary storage variable that has excess bits to store any overflows. For example, on the Intel x86 platform, a 32 bits variable would suffice for 16 bits PCM data.

In conclusion, the invention provides compensation for the amplitude reduction of input signals of a sigma-delta A/D converter. Specifically, the invention provides scaling of the amplitude of the PCM data back to the full-scale value achievable within the width of a data path. Furthermore, the invention achieves the full-scale value of the PCM data in accordance with the sampling rate or recording frequency of input signals en route to a sigma-delta A/D converter.

Advantageously, the invention is able to generate a scaling factor based on a sampling or recording frequency of input signals en route to a sigma-delta converter. Moreover, the invention is able to change to a new scaling factor in response to a new sampling or recording frequency. In one embodiment of the invention, scaling factors or contents of scaling factor lookup table can be dynamically changed. In particular, the methods for generating and changing scaling factors can be implemented in software for a general purpose CPU. Additionally, the invention adds little to the latency of the data stream.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A method for processing PCM data generated by a sigma-delta analog/digital (A/D) converter, said method comprising the steps of:

a) determining a scaling factor in accordance with a sampling frequency of an input signal to be processed by said sigma-delta A/D converter, said scaling factor adapted for scaling said PCM data into having maximum dynamic range allowed by the width of a data path associated with said sigma-delta A/d converter; and b) scaling said PCM data into maximum dynamic range allowed by the width of said data path by using said scaling factor.

2. The method of claim 1, wherein said step b) comprises the steps of:

in response to an interrupt from an audio digital controller coupled to said sigma-delta A/D converter, copying a block of PCM data from a direct memory access (DMA) buffer by a software device driver;

scaling said copied block of PCM data via said device driver by multiplying said PCM data by said scaling factor;

railing said scaled PCM data by said device driver such that the dynamic range of said PCM data remains within the width of said data path.

3. The method of claim 1, wherein said step b) comprises the steps of:

in response to a request from an application, copying a block of PCM data within a DMA buffer by a software device driver;

scaling said copied block of PCM data via said device driver by multiplying said PCM data by said scaling factor; and railing said scaled PCM data by said device driver such that the dynamic range of said PCM data remains within the width of said data path.

4. The method of claim 1, wherein said step a) comprises the step of:

determining said scaling factor using a lookup table, wherein said lookup table has a range of sampling frequencies and their corresponding scaling factors.

5. The method of claim 1, wherein said step a) comprises the step of:
   determining said scaling factor using a formula, said formula specifying an inverse relation between a sampling frequency and a scaling factor.

6. The method of claim 1, wherein said step a) comprises the step of:
   determining said scaling factor using runtime calibration that builds a lookup table for said scaling factor in accordance with its corresponding sampling frequency.

7. The method of claim 1, wherein the width of the data path is 16 bits.

8. The method of claim 1, wherein said PCM data is generated from an audio sigma-delta A/D converter.

9. The method of claim 1, wherein said step b) comprises the steps of:
   polling continually by an application for new PCM data to start consumption of said new PCM data;
   in response to a presence of said new PCM data, copying a block of said new PCM data within a DMA Buffer by a software device driver;
   scaling said copied block of PCM data via said device driver by multiplying said PCM data by said scaling factor; and
   railing said scaled new PCM data by said device driver such that the dynamic range of said new PCM data remains within the width of said data path.

10. A computer storage medium storing therein computer readable code for causing a computer system to execute the steps of processing PCM data, said steps comprising:
   a) determining a scaling factor in accordance with a sampling frequency of an input signal to be processed by said sigma-delta A/D converter, said scaling factor adapted for scaling said PCM data into having maximum dynamic range allowed by the width of a data path associated with said sigma-delta A/d converter; and
   b) scaling said PCM data into maximum dynamic range allowed by the width of said data path by using said scaling factor.

11. The computer storage medium of claim 10, wherein said step b) comprises the steps of:
   in response to an interrupt from a audio digital controller coupled to said sigma-delta A/D converter, copying a block of PCM data within a direct memory access (DMA) buffer by a software device driver;
   scaling said copied block of PCM data via said device driver by multiplying said PCM data by said scaling factor;
   railing said scaled PCM data by said device driver such that the dynamic range of said PCM data remains within the width of said data path; and
   sending said scaled PCM data by said device driver to a user/application buffer for data consumption.

12. The computer storage medium of claim 10, wherein said step b) comprises the steps of:
   in response to a request from an application, copying a block of PCM data within a DMA Buffer for scaling by a software device driver;
   scaling said copied block of PCM data via said device driver by multiplying said PCM data by said scaling factor; railing said scaled PCM data by said device driver such that the dynamic range of said PCM data remains within the width of said data path; and
   sending said scaled PCM data by said device driver to a user/application buffer for data consumption by said software application program.

13. The computer storage medium of claim 10, wherein said step a) comprises the step of:
   determining said scaling factor using a lookup table, wherein said lookup table has a range of sampling frequencies and their corresponding scaling factors.

14. The computer storage medium of claim 10, wherein said step a) comprises the step of:
   determining said scaling factor using a formula, said formula specifying an inverse relation between a sampling frequency and a scaling factor.

15. The computer storage medium of claim 10, wherein said step a) comprises the step of:
   determining said scaling factor using runtime calibration that builds a lookup table for said scaling factor in accordance with its corresponding sampling frequency.

16. The computer storage medium of claim 10, wherein the width of the data path is 16 bits.

17. The computer storage medium of claim 10, wherein said PCM data is generated from an audio sigma-delta A/D converter.

18. The computer storage medium of claim 10, wherein said step b) comprises the steps of:
   polling continually by an application for new PCM data to start consumption of said new PCM data;
   in response to a presence of said new PCM data, copying a block of said new PCM data within a DMA Buffer by a software device driver;
   scaling said copied block of PCM data via said device driver by multiplying said PCM data by said scaling factor; and
   railing said scaled new PCM data by said device driver such that the dynamic range of said new PCM data remains within the width of said data path.

19. A signal processing system for processing PCM data generated by a sigma-delta analog/digital (A/D) converter, said signal processing system adapted to perform steps comprising of:
   a) determining a scaling factor in accordance with a sampling frequency of an input signal to be processed by said sigma-delta A/D converter, said scaling factor adapted for scaling said PCM data into having maximum dynamic range allowed by the width of a data path associated with said sigma-delta A/d converter; and
   b) scaling said PCM data into maximum dynamic range allowed by the width of said data path by using said scaling factor.

20. The signal processing system of claim 19, wherein said step b) performed by said signal processing system comprises the steps of:
   in response to an interrupt from a audio digital controller coupled to said sigma-delta A/D converter, copying a block of PCM data within a direct memory access (DMA) buffer by a device driver coupled to said sigma-delta A/D converter;
   scaling said copied block of PCM data via said device driver by multiplying said PCM data by said scaling factor;
   railing said scaled PCM data by said device driver such that the dynamic range of said PCM data remains within the width of said data path; and
   sending said scaled PCM data by said device driver to a user/application buffer for data consumption.

21. The signal processing system of claim 19, wherein said step b) performed by said signal processing system comprises the steps of:

in response to a request from an application, copying a block of PCM data within a DMA Buffer by a device driver coupled to said sigma-delta A/D converter;

scaling said copied block of PCM data via said device driver by multiplying said PCM data by said scaling factor;

railing said scaled PCM data by said device driver such that the dynamic range of said PCM data remains within the width of said data path; and sending said scaled PCM data by said device driver to a user/application buffer for data consumption.

22. The signal processing system of claim 19, wherein said step a) performed by said signal processing system comprises the step of:

determining said scaling factor using a lookup table, wherein said lookup table has a range of sampling frequencies and their corresponding scaling factors.

23. The signal processing system of claim 19, wherein said step a) performed by said signal processing system comprises the step of:

determining said scaling factor using a formula, said formula specifying an inverse relation between a sampling frequency and a scaling factor.

24. The signal processing system of claim 19, wherein said step a) performed by said signal processing system comprises the step of:

determining said scaling factor using runtime calibration that builds a lookup table for said scaling factor in accordance with its corresponding sampling frequency.

25. The signal processing system of claim 19, wherein the width of the data path is 16 bits.

26. The signal processing system of claim 19, wherein said PCM data is generated from an audio sigma-delta A/D converter.

27. The signal processing system of claim 19, wherein said step b) performed by said signal processing system comprises the steps of:

polling continually by an application for new PCM data to start consumption of said new PCM data;

in response to a presence of said new PCM data, copying a block of said new PCM data within a DMA Buffer by a software device driver;

scaling said copied block of PCM data via said device driver by multiplying said PCM data by said scaling factor; and railing said scaled new PCM data by said device driver such that the dynamic range of said new PCM data remains within the width of said data path.

* * * * *